United States Patent
Pillow et al.

(10) Patent No.: US 8,604,464 B2
(45) Date of Patent: Dec. 10, 2013

(54) BLUE LIGHT-EMITTING MATERIAL

(75) Inventors: Jonathan Pillow, Cambridge (GB); Martin Humphries, Cambridge (GB); Shigeya Kobayashi, Tsukuba (JP)

(73) Assignees: Cambridge Display Technology Limited, Cambridgeshire (GB); Sumitomo Chemical Company Limited, Tokyo (JP)

( * ) Notice: Subject to any disclaimer, the term of this patent is extended or adjusted under 35 U.S.C. 154(b) by 252 days.

(21) Appl. No.: 13/056,108

(22) PCT Filed: Jul. 30, 2009

(86) PCT No.: PCT/GB2009/001874
§ 371 (c)(1), (2), (4) Date: Apr. 22, 2011

(87) PCT Pub. No.: WO2010/013006
PCT Pub. Date: Feb. 4, 2010

(65) Prior Publication Data
US 2011/0186828 A1   Aug. 4, 2011

(30) Foreign Application Priority Data
Aug. 1, 2008   (GB) .................................. 0814161.6

(51) Int. Cl.
*H01L 35/24* (2006.01)

(52) U.S. Cl.
USPC ..................... 257/40; 257/E51.001

(58) Field of Classification Search
USPC ........................... 257/40, E51.001
See application file for complete search history.

(56) References Cited

U.S. PATENT DOCUMENTS

| | | | |
|---|---|---|---|
| 5,150,006 | A | 9/1992 | Van Slyke et al. |
| 5,432,014 | A | 7/1995 | Sano et al. |
| 5,621,131 | A | 4/1997 | Kreuder et al. |
| 5,723,873 | A | 3/1998 | Yang |
| 5,798,170 | A | 8/1998 | Zhang et al. |
| 6,083,634 | A | 7/2000 | Shi |
| 6,268,695 | B1 | 7/2001 | Affinito |
| 6,353,083 | B1 | 3/2002 | Inbasekaran et al. |
| 6,953,628 | B2 | 10/2005 | Kamatani et al. |
| 7,030,138 | B2 | 4/2006 | Fujimoto et al. |
| 7,094,477 | B2 | 8/2006 | Kamatani et al. |
| 7,125,998 | B2 | 10/2006 | Stossel et al. |
| 7,147,935 | B2 | 12/2006 | Kamatani et al. |
| 7,238,435 | B2 | 7/2007 | Kamatani et al. |
| 2002/0117662 | A1 | 8/2002 | Nii |
| 2002/0182441 | A1 | 12/2002 | Lamansky et al. |
| 2003/0186080 | A1 | 10/2003 | Kamatani et al. |

(Continued)

FOREIGN PATENT DOCUMENTS

| | | |
|---|---|---|
| CN | 1708528 A | 12/2005 |
| CN | 1835985 A | 9/2006 |

(Continued)

OTHER PUBLICATIONS

Becker et al., "Optimisation of polyfluorenes for light emitting applications", *Synthetic Metals*, 125:73-80 (2002).

(Continued)

*Primary Examiner* — Anthony Ho
(74) *Attorney, Agent, or Firm* — Marshall, Gerstein & Borun LLP

(57) ABSTRACT

A light-emitting material comprising a conjugated polymer and a blue-light emitting perylene.

40 Claims, 1 Drawing Sheet

(56) References Cited

U.S. PATENT DOCUMENTS

| | | |
|---|---|---|
| 2004/0038075 A1 | 2/2004 | Wang et al. |
| 2004/0147555 A1 | 7/2004 | Fujimoto et al. |
| 2005/0209422 A1 | 9/2005 | O'Dell et al. |
| 2006/0058494 A1 | 3/2006 | Busing et al. |
| 2006/0177694 A1 | 8/2006 | Kamatani et al. |
| 2006/0229427 A1 | 10/2006 | Becker et al. |
| 2007/0176164 A1 | 8/2007 | Sato et al. |
| 2009/0014690 A1 | 1/2009 | Falcou et al. |
| 2011/0227057 A1 | 9/2011 | Kosuge et al. |
| 2012/0085994 A1 | 4/2012 | Pillow et al. |

FOREIGN PATENT DOCUMENTS

| | | |
|---|---|---|
| CN | 1852934 A | 10/2006 |
| EP | 0 707 020 A2 | 4/1996 |
| EP | 0 842 208 A1 | 5/1998 |
| EP | 0 880 303 A1 | 11/1998 |
| EP | 0 901 176 A2 | 3/1999 |
| EP | 0 947 123 A1 | 10/1999 |
| EP | 0 949 850 A1 | 10/1999 |
| EP | 1 245 659 A1 | 10/2002 |
| GB | 2 340 304 A | 2/2000 |
| GB | 2 348 316 A | 9/2000 |
| JP | 2002-324679 A | 11/2002 |
| JP | 2004-527628 A | 9/2004 |
| JP | 2005-158520 A | 6/2005 |
| JP | 2005-528492 A | 9/2005 |
| JP | 2010-126511 A | 6/2010 |
| JP | 2012-524139 A | 10/2012 |
| WO | WO-98/57381 A1 | 12/1998 |
| WO | WO-99/48160 A1 | 9/1999 |
| WO | WO-00/48258 A1 | 8/2000 |
| WO | WO-00/53656 A1 | 9/2000 |
| WO | WO-00/55927 A1 | 9/2000 |
| WO | WO-01/19142 A1 | 3/2001 |
| WO | WO-01/42331 A1 | 6/2001 |
| WO | WO-01/62869 A1 | 8/2001 |
| WO | WO-01/81649 A1 | 11/2001 |
| WO | WO-02/26856 A1 | 4/2002 |
| WO | WO-02/31896 A2 | 4/2002 |
| WO | WO-02/44189 A1 | 6/2002 |
| WO | WO-02/45466 A1 | 6/2002 |
| WO | WO-02/066552 A1 | 8/2002 |
| WO | WO-02/068435 A1 | 9/2002 |
| WO | WO-02/081448 A1 | 10/2002 |
| WO | WO-02/084759 A1 | 10/2002 |
| WO | WO-03/018653 A1 | 3/2003 |
| WO | WO-03/022908 A1 | 3/2003 |
| WO | WO-2007/071969 A2 | 6/2007 |

OTHER PUBLICATIONS

Bernius et al., "Progress with Light-Emitting Polymers", *Adv. Mater.*, 12(23):1737-1750 (2000).

Burn et al., "Synthesis of a Segmented Conjugated Polymer chain Giving a blue-shifted Electroluminescence and Improved Efficiency", *J. Chem. Soc., Chem. Commun.*, 32-34 (1992).

Chen et al., "Recent Developments in Molecular Organic Electroluminescent Materials", *Macromol. Symp.*, 125:1-48 (1997).

Coventry et al., "Selective Ir-catalysed borylation of polycyclic aromatic hydrocarbons: structures of naphthalene-2,6-bis(boronate), pyrene-2,7-bis(boronate) and perylene-2,5,8,11-tetra(boronate) esters", *Chem. Commun.*, 2172-2174 (2005).

Ego et al., "Attaching Perylene Dyes to Polyfluorene: Three Simple, Efficient Methods for Facile Color Tuning of Light-Emitting Polymers", *J. Am. Chem. Soc.*, 125:437-443 (2003).

Grem et al., "Realization of a Blue-Light-Emitting Device using Poly(p-phenylene)," *Adv. Mater.*, 4(1):36-37 (1992).

Lee et al., "Electroluminescence Characteristics of Blue Light Emitting Copolymer Containing Perylene and Triazine Moieties in the Side Chain", *Polymer* (korea), 28(5):367-373 (2004). Abstract Only.

Lee et al., "Structural effects of a light emitting copolymer having perylene moieties in the side chain on the electroluminescent characteristics", *Materials Science and Engineering C*, 24:87-90 (2004).

Liu et al., "Molecular Design on Highly Efficient White Electroluminescence from a Single-Polymer System with Stimultaneous Blue, Green, and Red Emission", *Adv. Mater.*, 19:531-535 (2007).

Mi et al., "Reduction of molecular aggregation and its application to the high-performance blue perylene-doped organic electroluminescent device", *Appl. Phys. Lett.*, 75(26):4055-4057 (1999).

Michaelson, "The work function of the elements and its periodicity", *J. Applied Physics*, 48(11): 4729-4733 (1977).

Niu et al., "Thermal annealing below the glass transition temperature: A general way to increase performance of light-emitting diodes based on copolyfluorenes", *Applied Physics Letters*, 81(4):634-636 (2002).

Ohmori et al., "Blue Electroluminescent Diodes Utilizing Poly (alkylfluorene)", *Japanese J. App. Phys.*, 30911B):L1941-L1943 (1991).

Setayesh et al., "Bridging the Gap between Polyfluorene and Ladder-Poly-p-phenylene: Synthesis and Charactrization of Poly-2,8-indenofluorene", *Macromolecules*, 33:2016-2020 (2000).

Setayesh et al., "Polyfluorenes with polyphenylene dendron side chains: toward non-aggregating, light-emitting polymers", *J. Am. Chem, Soc.*, 123:946-953 (2001).

Shu et al., "Spirobifluorene-Linked Bisanthracene: An Efficient Blue Emitter with Pronounced Thermal Stability", *Chem.Mater.*, 16:930-934 (2004).

Shu et al., "Synthesis and characterization of spiro-linked poly(terfluorene): a blue-emitting polymer with controlled conjugated length", *J.Materials Chem.*, 12:2893-2897 (2002).

Tasch et al., "Efficient red- and orange-light-emitting diodes realized by excitation energy transfer from flue-light-emitting conjugated polymers", *Phys. Rev., B*, 56:4479-4483 (1997). Abstract Only.

Tokito et al., "Metal oxides as a hole-injecting layer for an organic electroluminescent device", *J. Phys. D: Appl. Phys.*, 29:2750-2753 (1996).

Yamaguchi et al., "Effects of B and C on the ordering of L10-CoPt thin films", *Applied Physics Letters*, 79(13):2001-2003 (2001).

Yamamoto, "Electrically Conducting and Thermally Stable π-Conjugated Poly (Arylene)s Prepared by Organometallic Processes", *Polymer Science*, 17:1153-1205 (1993).

Yang et al., "Efficient blue polymer light-emitting diodes from a series of soluble poly(paraphenylene)s", *J. Appl. Phys.*, 79(2):934-939 (1996).

Combined Search and Examination Report for GB0814161.6 dated Dec. 29, 2008.

International Preliminary Report on Patentability for Application No. PCT/GB2009/001874, dated Feb. 1, 2011.

International Search Report and Written Opinion for Application No. PCT/GB2009/001874, dated Aug. 6, 2010.

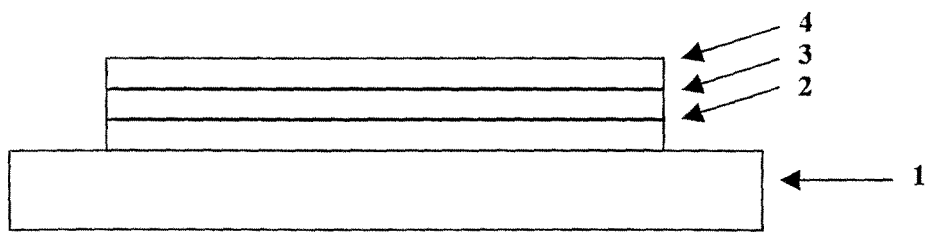

BLUE LIGHT-EMITTING MATERIAL

BACKGROUND OF THE INVENTION

1. Field of the Invention

The present invention is concerned with a blue-light emitting material and with an organic light-emitting device containing the same.

2. Related Technology

A typical organic light-emitting device (OLED) comprises a substrate, on which is supported an anode, a cathode and a light-emitting layer situated in between the anode and cathode and comprising at least one polymeric electroluminescent material. In operation, holes are injected into the device through the anode and electrons are injected into the device through the cathode. The holes and electrons combine in the light-emitting layer to form an exciton which then undergoes radioactive decay to emit light.

Other layers may be present in the OLED, for example a layer of hole injection material, such as poly(ethylene dioxythiophene)/polystyrene sulphonate (PEDOT/PSS), may be provided between the anode and the light-emitting layer to assist injection of holes from the anode to the light-emitting layer. Further, a hole transport layer may be provided between the anode and the light-emitting layer to assist transport of holes to the light-emitting layer.

Luminescent conjugated polymers are an important class of materials that will be used in organic light emitting devices for the next generation of information technology based consumer products. The principle interest in the use of polymers, as opposed to inorganic semiconducting and organic dye materials, lies in the scope for low-cost device manufacturing, using solution-processing of film-forming materials. Since the last decade much effort has been devoted to the improvement of the emission efficiency of organic light emitting diodes (OLEDs) either by developing highly efficient materials or efficient device structures.

A further advantage of conjugated polymers is that they may be readily formed by Suzuki or Yamamoto polymerisation. This enables a high degree of control over the regioregulatory of the resultant polymer.

Blue light-emitting polymers have been disclosed. "Synthesis of a segmented conjugated polymer chain giving a blue-shifted electroluminescence and improved efficiency" by P. L. Burn, A. B. Holmes, A. Kraft, D. D. C. Bradley, A. R. Brown and R. H. Friend, J. Chem. Soc., Chem. Commun., 1992, 32 described the preparation of a light-emitting polymer that had conjugated and non-conjugated sequences in the main chain and exhibited blue-green electroluminescence with an emission maximum at 508 nm. Blue light-emission was observed in two conjugated polymers. Poly(p-phenylene) sandwiched between indium-tin oxide and aluminium contacts has been published by G. Grem, G. Leditzky, B. Ullrich and G. Leising in Adv. Mater. 1992, 4, 36. Similarly, Y. Ohmori, M. Uchida, K. Muro and K. Yoshino reported on "Blue electroluminescent diodes utilizing poly (alkylfluorene)" in Jpn. J. Appl. Phys., 1991, 30, L1941.

Applied Physics Letters, Vol. 75, No. 26, 27 December 1999, 4055-4057 "Reduction of molecular aggregation and its application to the high-performance blue perylene-doped organic electroluminescent device" discloses electroluminescent devices made using perylene as adopant in bis(2-methyl-8-quinolinolato)(para-phenylphenolato) aluminium (III).

WO 00/55927 discloses an organic polymer having a plurality of regions along the length of the polymer backbone and comprising two or more of the following:

(i) a first region for transporting negative charge carriers and having a first bandgap defined by a first LUMO level and a first HOMO level; and
(ii) a second region for transporting positive charge carriers and having a second bandgap defined by a second LUMO level and a second HOMO level; and
(iii) a third region for accepting and combining positive and negative charge carriers to generate light and having a third bandgap defined by a third LUMO level and a third HOMO level,
wherein each region comprises one or more monomers and the quantity and arrangement of the monomers in the organic polymer is elected so that the first, second and third bandgaps are distinct from one another in the polymer. There is no mention of perylenes.

J. Am. Chem. Soc., 2003, 125, 437-443 "Attaching Perylene Dyes to Polyfluorene: Three Simple, Efficient Methods for Facile Color Tuning of Light-Emitting Polymers" discloses attachment of perylene dyes to polyfluorene chains either as (i) comonomers in the main chain, (ii) as endcapping groups at the chain termini, or (iii) as pendant side groups.

Polymer (Korea), 2004, 28(5), 367-373 "Electroluminescence characteristics of blue light emitting copolymer containing perylene and triazine moieties in the side chain" discloses blue light emitting copolymers containing perylene and triazine moieties as light emitting an electron transporting units in the polymer side chain.

Chem. Commun., 2005, 2172-2174 "Selective Ir-catalysed borylation of polycyclic aromatic hydrocarbons: structures of naphthalene-2,6-bis(boronate), pyrene-2,7-bis(boronate) and perylene-2,5,8,11-tetra(boronate) esters" discloses the production of pyrene-bis(boronate) and perylene-tetra(boronate) esters to produce conjugated systems and optical materials.

SUMMARY OF THE INVENTION

In view of the above, it is a problem of the present invention to provide a new blue-light emitting material, preferably with good or improved lifetime properties as compared with some prior art blue-light emitting materials.

As such, a first aspect of the present invention provides a light-emitting material comprising a conjugated polymer and a blue-light emitting perylene.

In one embodiment, the light-emitting material as a whole is blue-light emitting. However, this is not essential since the light-emitting material may contain emitting species in addition to the blue-light emitting perylene, which result in a different colour of emission from the light-emitting material as a whole.

For the purposes of the present invention, the term "blue-light emitting" means that the photoluminescent light emission from the perylene has a peak wavelength in the range of from 400 to 500 nm, preferably 430 to 500 nm.

Any substituent may be used provided it does not shift the colour of the perylene out of the range of blue light emission. Examples of substituents include solubilising groups such as $C_{1-20}$ alkyl or alkoxy; electron withdrawing groups such as fluorine, nitro or cyano; substituents for increasing glass transition temperature (Tg) of the polymer; and aryl groups such as optionally substituted phenyl, unsubstituted phenyl or phenyl substituted with one or more alkyl or alkoxy groups. A preferred substituent is t-butyl.

When suitably positioned, substituents can act to protect the fused aromatic rings of the perylene, for example by blocking reactive sites of the perylene. They may also serve to prevent aggregation of the material. Further, they may serve to separate emissive cores from one another, thus preventing colour shifting effects and excimer formation.

Optionally, substituents present on the perylene may be linked together, either by a direct bond or by a linking group or linking atom.

The blue-light emitting perylene may be blended with the conjugated polymer. In this embodiment, preferably, a small molecule comprises the blue-light emitting perylene. The blue-light emitting perylene may be as defined anywhere herein. Preferably, a small molecule comprising a blue-light emitting perylene has solubilising substituents groups.

A preferred blue light emitting perylene according to this embodiment has the following formula A:

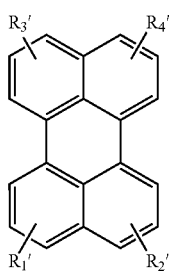

A wherein R1'—R4' are optional substituents independently selected from the group consisting of alkyl, optionally substituted aryl, alkoxy, thioether and amine. Preferred substituents are alkyl, more preferably branched alkyl; and phenyl, more preferably alkyl-substituted phenyl. For ease of synthesis, R1'-R4' are preferably the same. Preferably, all four substituents R1'-R4' are present.

The substituents R1'—R4' are present in the 2, 5, 8 and 11 positions.

Preferably, the compound of formula A has the following formula B:

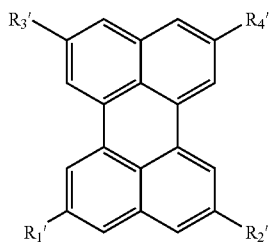

B wherein R1'-R4' are as defined above.

The blue-emitting perylene may be blended with the conjugated polymer in an amount up to 5 mol %, more preferably 0.1 to 2 mol %, still more preferably about 0.2-0.5 mol %.

Alternatively, the blue-light emitting perylene may be covalently bound to the backbone of the conjugated polymer, for example as a side chain, in the polymer main chain or as an end group of the polymer. In either case, the bandgap of the conjugated polymer should be sufficiently large so as not to quench emission from the blue-light emitting perylene.

When the blue-light emitting perylene is covalently bound as a side chain to the backbone of the conjugated polymer, the perylene may be conjugatively or non-conjugatively bound.

The conjugated polymer preferably comprises an electron transporting repeat unit and/or a hole transporting repeat unit.

Preferred electron transporting repeat units comprise fluorene. The term "fluorene" used herein includes spirofluorene and indenofluorene within its meaning. In order to optimise electron transport, fluorene units are preferably connected in chains of three or more along the polymer backbone, as is known in the art.

A preferred electron transporting repeat unit comprises an optionally substituted 2,7-linked fluorene, most preferably having formula I:

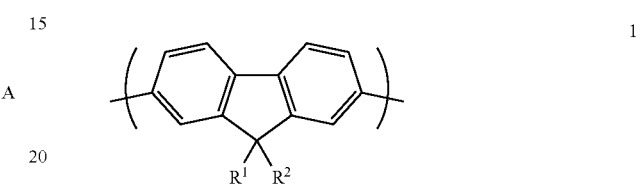

1 wherein $R^1$ and $R^2$ are independently selected from hydrogen or optionally substituted alkyl, alkoxy, aryl, arylalkyl, heteroaryl and heteroarylalkyl. More preferably, at least one of W and $R^2$ comprises an optionally substituted $C_4$-$C_{20}$ alkyl or aryl group.

Preferred hole transporting repeat units comprise amine, in particular, a triarylamine, preferably having formula 2:

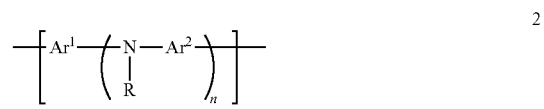

2 wherein $Ar^1$ and $Ar^2$ are optionally substituted aryl or heteroaryl groups, n is greater than or equal to 1, preferably 1 or 2, and R is H or a substituent, preferably a substituent. R is preferably alkyl or aryl or heteroaryl, most preferably aryl or heteroaryl. Any of the aryl or heteroaryl groups in the unit of formula 2 may be substituted. Preferred substituents include alkyl and alkoxy groups. Any of the aryl or heteroaryl groups in the repeat unit of Formula 2 may be linked by a direct bond or a divalent linking atom or group. Preferred divalent linking atoms and groups include O, S; substituted N; and substituted C.

Particularly preferred units satisfying formula 2 include units of formulae 3 to 5:

3

4

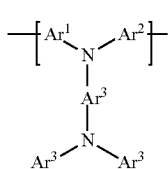

wherein Ar¹ and Ar² are as defined above; and Ar³ is optionally substituted aryl or heteroaryl. Where present, preferred substituents for Ar³ include alkyl and alkoxy groups.

Referring to the embodiment where the blue-light emitting perylene is covalently bound as a side chain to the backbone of the conjugated polymer, the colour of emission from the perylene will at least in part be determined by the connectivity of the perylene to the polymer. For example, in order for perylene to be blue-light emitting, the present inventors have determined that it should be connected in the 11- position if it is to be bound to the polymer either directly or through a conjugated spacer group (for simplicity, we refer throughout this specification to connection of perylene through its 11-position, however it will be appreciated that reference to the "11-position" encompasses similar connection and/or substitution at the 2, 5 and/or 8 positions). Thus, a side chain, blue-light emitting perylene comprises a structural unit have formula I:

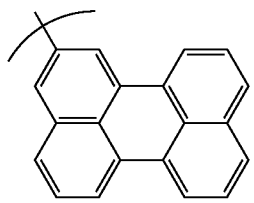

The structural unit shown by formula I may be substituted, for example at any one or more of the positions C2, C5, and C8, as shown below in formula II:

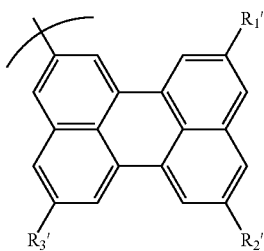

where $R_1'$, $R_2'$, and $R_3'$ each independently represent an optional substituent, as defined above. In one preferred embodiment, all of substituents $R_2'$, and $R_3'$ are present. $R_1'$, $R_2'$, and $R_3'$ can act to protect the fused rings of the perylene. Preferably, each of $R_1'$, $R_2'$, and $R_3'$ represents t-butyl.

The perylene may be connected to the backbone of the conjugated polymer via a spacer group, as shown by the repeat unit in formula III:

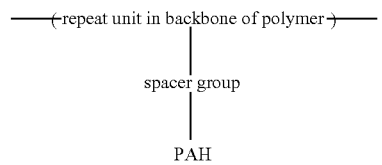

A spacer group may be conjugated or non-conjugated.

Conjugated spacer groups include phenyl, for example. However, it is preferred that there is little or no conjugation between the conjugated spacer group and the perylene in order to avoid the colour of emission of the perylene being shifted to a longer wavelength. In order to achieve this, the perylene is preferably bound to the conjugated spacer through its 11 position.

Non-conjugated spacer groups include alkyl, for example.

The perylene may also be directly linked to the polymer backbone.

The backbone of the conjugated polymer may comprise one or more different repeat units.

In one embodiment, it is preferred that the repeat unit in the backbone of the polymer, to which the perylene is bound, comprises a fluorene, more preferably a 9,9 disubstituted fluorene. The fluorene unit provides stability to the repeat unit as a whole.

When the perylene is bound to the conjugated polymer, the conjugated polymer may comprise a repeat unit having formula IV:

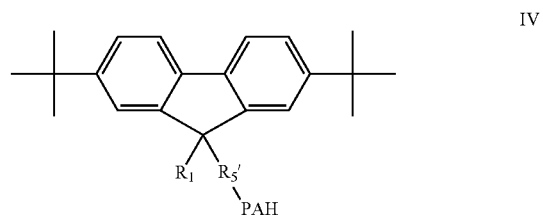

in which PAH represents a perylene.

Preferred repeat units having formula IV are shown in formulae V to VIII:

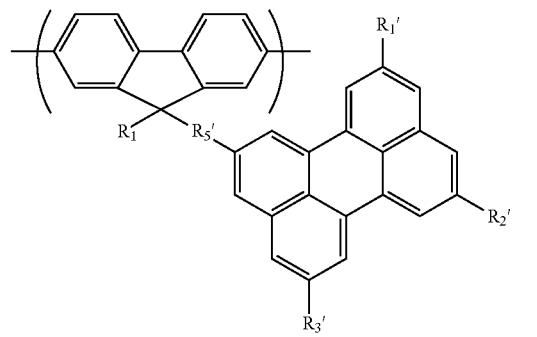

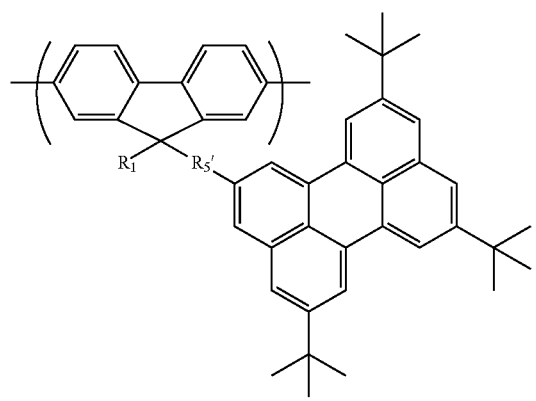

VI

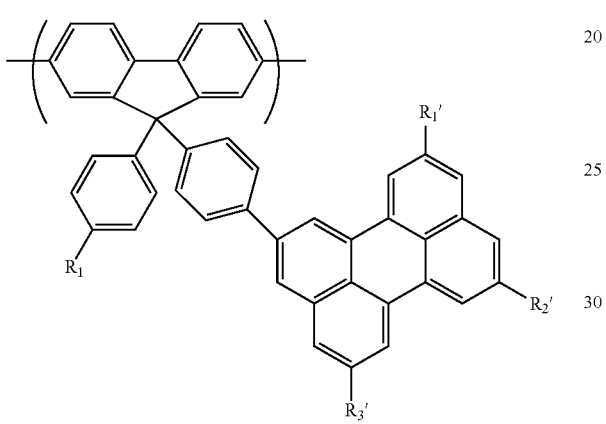

VII

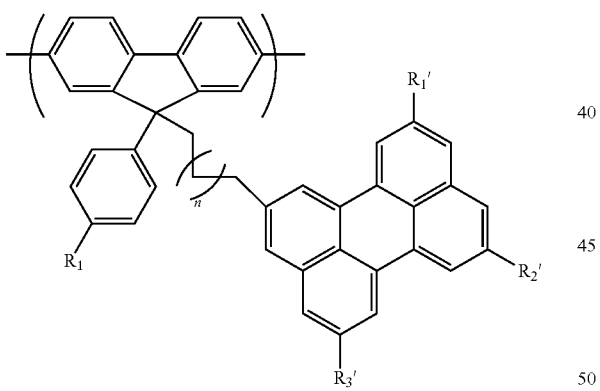

VIII where $R_1$, $R_1'$, $R_2'$, and $R_3'$ are as defined above; $R_5'$ is a spacer group, preferably alkylene, arylene (in particular phenylene), oxygen, nitrogen, sulphur or combinations thereof, in particular arylalkyl; and n is from 1-10.

Preferably, $R_1$ represents an optionally substituted $C_4$-$C_{20}$ alkyl or aryl group.

The concentration and location of perylene in the conjugated polymer preferably is such that the perylene do not interact with each other, since this could affect the colour of emission from the blue-light emitting perylene.

Referring to the embodiment where the blue-light emitting perylene is provided as a repeat unit in the backbone of the conjugated polymer, the perylene unit may be directly bound to adjacent repeat units or it may be bound via spacer groups. The perylene may be bound through any position, and substituted at any position, provided its blue emission is retained. Preferred repeat units according to this embodiment include formulae IX and X:

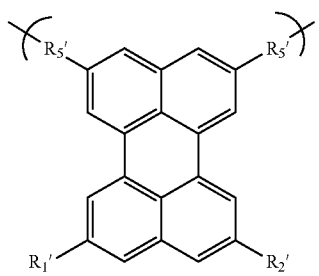

IX

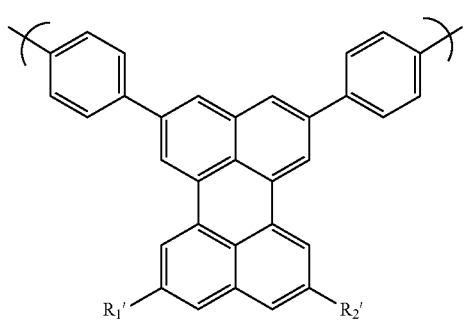

X wherein R1', R2' and R5' are as defined above.

Formulae IX and X illustrate linkage of the perylene repeat unit through its 8 and 11 positions, however it will be appreciated that analogous repeat units may be provided wherein the unit is linked through any combination of two of the 2,5,8 and 11 positions.

Referring to the embodiment where the blue-light emitting perylene is covalently bound as end group of the conjugated polymer, preferred end groups have formulae XI and XII:

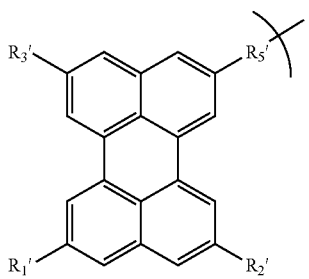

XI

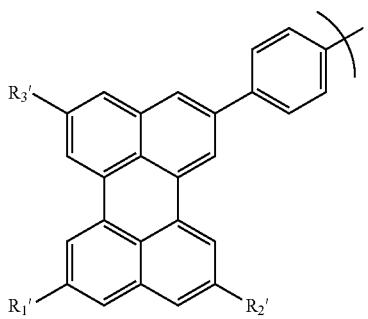

XII wherein R1', R2', R3' and R5' are as defined above.

The polymer is preferably a linear polymer, and the perylene end group is present at one or both ends of the polymer chain.

The conjugated polymer preferably contains up to 5 mol % of a repeat unit having one of formulae III to X above, more preferably 0.1 to 2 mol %, still more preferably about 0.2-0.5 mol %.

A second aspect of the present invention provides a method for making a material as defined in relation to the first aspect of the present invention.

Preferred methods for preparation of the conjugated polymer are Suzuki polymerisation as described in, for example, WO 00/53656 and Yamamoto polymerisation as described in, for example, T. Yamamoto, "Electrically Conducting And Thermally Stable Π-Conjugated Poly(arylene)s Prepared by Organometallic Processes", Progress in Polymer Science 1993, 17, 1153-1205. These polymerisation techniques both operate via a "metal insertion" wherein the metal atom of a metal complex catalyst is inserted between an aryl group and a leaving group of a monomer. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units and end groups comprising aryl groups as illustrated throughout this application may be derived from a monomer carrying a suitable leaving groups.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups include tosylate, mesylate and triflate.

The second aspect thus provides a method for making a material as defined in relation to the first aspect of the present invention using Suzuki polymerisation or Yamamoto polymerisation whereby monomers are polymerised, each monomer having at least two reactive groups. Preferably, the reactive groups are selected from boron derivative groups such as a boronic acid or boronic ester, halogen, tosylate, mesylate and triflate.

A third aspect of the present invention provides an organic light-emitting device (OLED) containing a material as defined in relation to the first aspect of the present invention. Typically, said material will be comprised in a layer of the device either alone of in combination with one or more other materials.

With reference to FIG. 1, the architecture of an OLED according to the third aspect of the invention typically comprises a transparent glass or plastic substrate 1, an anode 2 and a cathode 4. An electroluminescent layer 3 comprising the light-emitting material as defined in relation to the first aspect is provided between anode 2 and cathode 4.

In a practical device, at least one of the electrodes is semitransparent in order that light may be absorbed (in the case of a photoresponsive device) or emitted (in the case of an OLED). Where the anode is transparent, it typically comprises indium tin oxide.

Further layers may be located between anode 2 and cathode 3, such as charge transporting, charge injecting or charge blocking layers.

In particular, it is desirable to provide a conductive hole injection layer, which may be formed from a conductive organic or inorganic material provided between the anode 2 and the electroluminescent layer 3 to assist hole injection from the anode into the layer or layers of semiconducting polymer. Examples of doped organic hole injection materials include doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. Nos. 5,723,873 and 5,798,170; and poly (thienothiophene). Examples of conductive inorganic materials include transition metal oxides such as VOx MoOx and RuOx as disclosed in Journal of Physics D: Applied Physics (1996), 29(11), 2750-2753.

If present, a hole transporting layer located between anode 2 and electroluminescent layer 3 preferably has a HOMO level of less than or equal to 5.5 eV, more preferably around 4.8-5.5 eV. HOMO levels may be measured by cyclic voltammetry, for example.

If present, an electron transporting layer located between electroluminescent layer 3 and cathode 4 preferably has a LUMO level of around 3-3.5 eV.

Electroluminescent layer 3 may consist of the light-emitting material alone or may comprise the light-emitting material in combination with one or more further materials. In particular, the light-emitting material may be blended with hole and/or electron transporting materials as disclosed in, for example, WO 99/48160, or may comprise a luminescent dopant in a semiconducting host matrix. Alternatively, the light-emitting material may be covalently bound to a charge transporting material and/or host material.

Cathode 4 is selected from materials that have a workfunction allowing injection of electrons into the electroluminescent layer. Other factors influence the selection of the cathode such as the possibility of adverse interactions between the cathode and the electroluminescent material. The cathode may consist of a single material such as a layer of aluminium. Alternatively, it may comprise a plurality of metals, for example a bilayer of a low workfunction material and a high workfunction material such as calcium and aluminium as disclosed in WO 98/10621; elemental barium as disclosed in WO 98/57381, Appl. Phys. Lett. 2002, 81(4), 634 and WO 02/84759; or a thin layer of metal compound, in particular an oxide or fluoride of an alkali or alkali earth metal, to assist electron injection, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode will comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Optical devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device is preferably encapsulated with an encapsulant (not shown) to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A getter material for absorption of any atmospheric moisture and/or oxygen that may permeate through the substrate or encapsulant may be disposed between the substrate and the encapsulant.

The embodiment of FIG. 1 illustrates a device wherein the device is formed by firstly forming an anode on a substrate followed by deposition of an electroluminescent layer and a cathode, however it will be appreciated that the device of the invention could also be formed by firstly forming a cathode on a substrate followed by deposition of an electroluminescent layer and an anode.

A fourth aspect of the present invention provides a method of making an OLED as defined in relation to the third aspect. Preferably, the light-emitting material as defined in relation to the first aspect is deposited (optionally in combination with one or more further materials) from solution by solution processing to form a layer of the OLED.

Suitable solvents for polyarylenes, in particular polyfluorenes, include mono- or poly-alkylbenzenes such as toluene and xylene. Particularly preferred solution deposition techniques are spin-coating and inkjet printing.

Spin-coating is particularly suitable for devices wherein patterning of the electroluminescent material is unnecessary—for example for lighting applications or simple monochrome segmented displays.

Inkjet printing is particularly suitable for high information content displays, in particular full colour displays. Inkjet printing of OLEDs is described in, for example, EP 0880303.

Other solution deposition techniques include dip-coating, roll printing and screen printing.

If multiple layers of the OLED are formed by solution processing then the skilled person will be aware of techniques to prevent intermixing of adjacent layers, for example by crosslinking of one layer before deposition of a subsequent layer or selection of materials for adjacent layers such that the material from which the first of these layers is formed is not soluble in the solvent used to deposit the second layer.

A fifth aspect of the present invention provides a light source such as a full colour display comprising a device as defined in relation to the third aspect of the invention.

According to the fifth aspect, electroluminescent layer 3 may be patterned or unpatterned. A device comprising an unpatterned layer may be used an illumination source, for example. A white light emitting device is particularly suitable for this purpose. A device comprising a patterned layer may be, for example, an active matrix display or a passive matrix display. In the case of an active matrix display, a patterned electroluminescent layer is typically used in combination with a patterned anode layer and an unpatterned cathode. In the case of a passive matrix display, the anode layer is formed of parallel stripes of anode material, and parallel stripes of electroluminescent material and cathode material arranged perpendicular to the anode material wherein the stripes of electroluminescent material and cathode material are typically separated by stripes of insulating material ("cathode separators") formed by photolithography.

BRIEF DESCRIPTION OF THE DRAWINGS

The present invention now will be described in further detail with reference to the attached figures, in which:
FIG. 1 shows the basic architecture of an OLED.

DETAILED DESCRIPTION

Referring to the device according to the third aspect, the following general comments may be made regarding conjugated polymers.

Electroluminescent and/or charge transporting polymers include poly(arylene vinylenes) such as poly(p-phenylene vinylenes) and polyarylenes.

Polymers preferably comprise a first repeat unit selected from arylene repeat units as disclosed in, for example, Adv. Mater. 2000 12(23) 1737-1750 and references therein. Examplary first repeat units include: 1,4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example EP 0707020. Each of these repeat units is optionally substituted. Examples of substituents include solubilising groups such as $C_{1-20}$ alkyl or alkoxy; electron withdrawing groups such as fluorine, nitro or cyano; and substituents for increasing glass transition temperature (Tg) of the polymer.

Particularly preferred polymers comprise optionally substituted, 2,7-linked fluorenes, most preferably repeat units of formula 6:

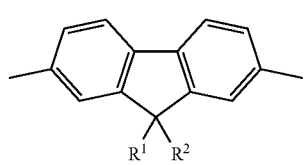

6 wherein $R^1$ and $R^2$ are independently selected from hydrogen or optionally substituted alkyl, alkoxy, aryl, arylalkyl, heteroaryl and heteroarylalkyl. More preferably, at least one of $R^1$ and $R^2$ comprises an optionally substituted $C_4$-$C_{20}$ alkyl or aryl group.

Polymers may provide one or more of the functions of hole transport, electron transport and emission depending on which layer of the device it is used in and the nature of co-repeat units.

In particular:
a homopolymer of fluorene repeat units, such as a homopolymer of 9,9-dialkylfluoren-2,7-diyl, may be utilised to provide electron transport.
a copolymer comprising triarylamine repeat unit, in particular a repeat unit 7:

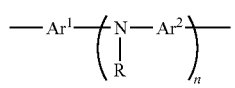

7 wherein $Ar^1$ and $Ar^2$ are optionally substituted aryl or heteroaryl groups, n is greater than or equal to 1, preferably 1 or 2, and R is H or a substituent, preferably a substituent. R is preferably alkyl or aryl or heteroaryl, most preferably aryl or heteroaryl. Any of the aryl or heteroaryl groups in the unit of formula 1 may be substituted. Preferred substituents include alkyl and alkoxy groups. Any of the aryl or heteroaryl groups in the repeat unit of Formula 1 may be linked by a direct bond or a divalent linking atom or group. Preferred divalent linking atoms and groups include O, S; substituted N; and substituted C.

Particularly preferred units satisfying Formula 1 include units of Formulae 8-10:

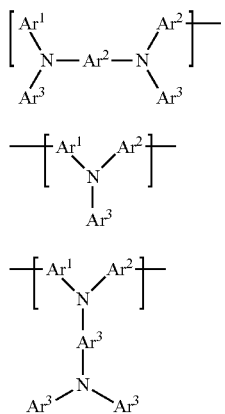

8

9

10 wherein $Ar^1$ and $Ar^2$ are as defined above; and $Ar^3$ is optionally substituted aryl or heteroaryl. Where present, preferred substituents for $Ar^3$ include alkyl and alkoxy groups.

Particularly preferred hole transporting polymers of this type are copolymers of the first repeat unit and a triarylamine repeat unit.

Electroluminescent copolymers may comprise an electroluminescent region and at least one of a hole transporting region and an electron transporting region as disclosed in, for example, WO 00/55927 and U.S. Pat. No. 6,353,083. If only one of a hole transporting region and electron transporting region is provided then the electroluminescent region may also provide the other of hole transport and electron transport functionality. Alternatively, an electroluminescent polymer may be blended with a hole transporting material and/or an electron transporting material. Polymers comprising one or more of a hole transporting repeat unit, electron transporting repeat unit and emissive repeat unit may provide said units in a polymer main-chain or polymer side-chain.

The different regions within such a polymer may be provided along the polymer backbone, as per U.S. Pat. No. 6,353,083, or as groups pendant from the polymer backbone as per WO 01/62869.

The blue light-emitting perylene polymers of the invention may be used as host materials for phosphorescent emitters, in which case the emission of the polymer/phosphorescent emitter composition will be shifted to the colour of emission of the phosphorescent material.

Preferred phosphorescent emitters include metal complexes comprising optionally substituted complexes of formula (26):

$$ML^1_q L^2_r L^3_s \qquad 26$$

wherein M is a metal; each of $L^1$, $L^2$ and $L^3$ is a coordinating group; q is an integer; r and s are each independently 0 or an integer; and the sum of (a. q)+(b. r)+(c.s) is equal to the number of coordination sites available on M, wherein a is the number of coordination sites on $L^1$, b is the number of coordination sites on $L^2$ and c is the number of coordination sites on $L^3$.

Heavy elements M induce strong spin-orbit coupling to allow rapid intersystem crossing and emission from triplet or higher states (phosphorescence). Suitable heavy metals M include:
lanthanide metals such as cerium, samarium, europium, terbium, dysprosium, thulium, erbium and neodymium; and
d-block metals, in particular those in rows 2 and 3 i.e. elements 39 to 48 and 72 to 80, in particular ruthenium, rhodium, palladium, rhenium, osmium, iridium, platinum and gold.

Suitable coordinating groups for the f-block metals include oxygen or nitrogen donor systems such as carboxylic acids, 1,3-diketonates, hydroxy carboxylic acids, Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission colour is determined by the choice of the metal. The sharp emission is generally narrow, resulting in a pure colour emission useful for display applications.

The d-block metals are particularly suitable for emission from triplet excited states. These metals form organometallic complexes with carbon or nitrogen donors such as porphyrin or bidentate ligands of formula 27:

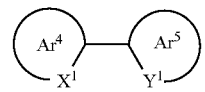

27 wherein $Ar^4$ and $Ar^5$ may be the same or different and are independently selected from optionally substituted aryl or heteroaryl; $X^1$ and $Y^1$ may be the same or different and are independently selected from carbon or nitrogen; and $Ar^4$ and $Ar^5$ may be fused together. Ligands wherein $X^1$ is carbon and $Y^1$ is nitrogen are particularly preferred.

Examples of bidentate ligands are illustrated below:

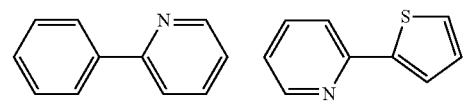

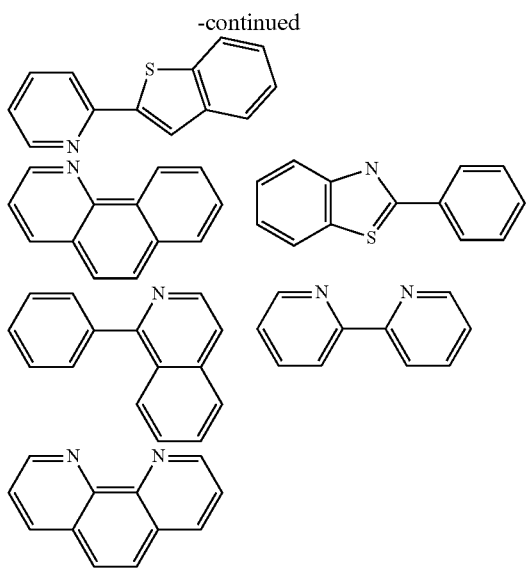

Each of Ar⁴ and Ar⁵ may carry one or more substituents. Two or more of these substituents may be linked to form a ring, for example an aromatic ring. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalise the ligand for attachment of further groups as disclosed in WO 02/68435 and EP 1245659; and dendrons which may be used to obtain or enhance solution processability of the metal complex as disclosed in WO 02/66552.

A light-emitting dendrimer typically comprises a light-emitting core bound to one or more dendrons, wherein each dendron comprises a branching point and two or more dendritic branches. Preferably, the dendron is at least partially conjugated, and at least one of the core and dendritic branches comprises an aryl or heteroaryl group. In one preferred embodiment, the branch group comprises Other ligands suitable for use with d-block elements include diketonates, in particular acetylacetonate (acac); triarylphosphines and pyridine, each of which may be substituted.

Main group metal complexes show ligand based, or charge transfer emission. For these complexes, the emission colour is determined by the choice of ligand as well as the metal.

The host material and metal complex may be combined in the form of a physical blend. Alternatively, the metal complex may be chemically bound to the host material. In the case of a polymeric host, the metal complex may be chemically bound as a substituent attached to the polymer backbone, incorporated as a repeat unit in the polymer backbone or provided as an end-group of the polymer as disclosed in, for example, EP 1245659, WO 02/31896, WO 03/18653 and WO 03/22908.

A wide range of fluorescent low molecular weight metal complexes are known also and have been demonstrated in organic light emitting devices [see, e.g., Macromol. Sym. 125 (1997) 1-48, U.S. Pat. No. 5,150,006, U.S. Pat. No. 6,083,634 and U.S. Pat. No. 5,432,014]. Again, a polymer comprising perylene repeat units or end group(s) may be used as a host material for such emitters. Suitable ligands for di or trivalent metals include: oxinoids, e.g. with oxygen-nitrogen or oxygen-oxygen donating atoms, generally a ring nitrogen atom with a substituent oxygen atom, or a substituent nitrogen atom or oxygen atom with a substituent oxygen atom such as 8-hydroxyquinolate and hydroxyquinoxalinol-10-hydroxybenzo (h) quinolinato (II), benzazoles (III), schiff bases, azoindoles, chromone derivatives, 3-hydroxyflavone, and carboxylic acids such as salicylato amino carboxylates and ester carboxylates. Optional substituents include halogen, alkyl, alkoxy, haloalkyl, cyano, amino, amido, sulfonyl, carbonyl, aryl or heteroaryl on the (hetero) aromatic rings which may modify the emission colour.

EXAMPLES

Example 1

A soluble small molecular blue-emitting perylene was prepared according to the following scheme:

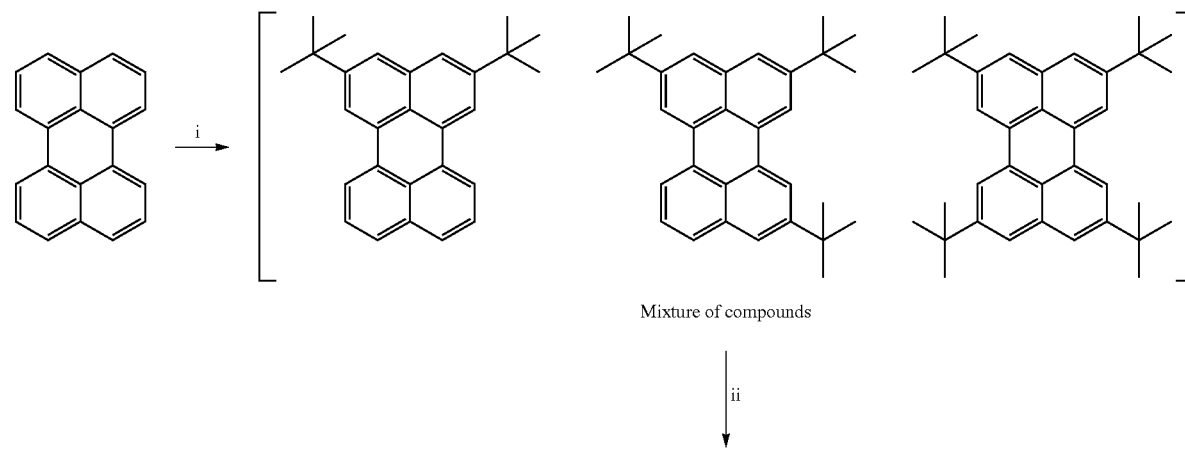

Mixture of compounds ii

17

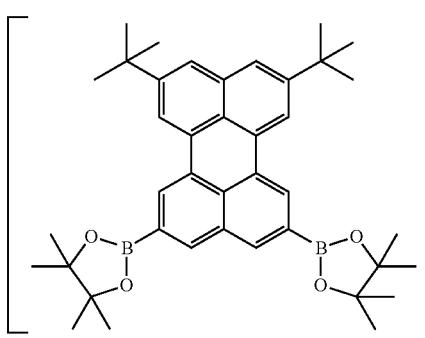

18

-continued

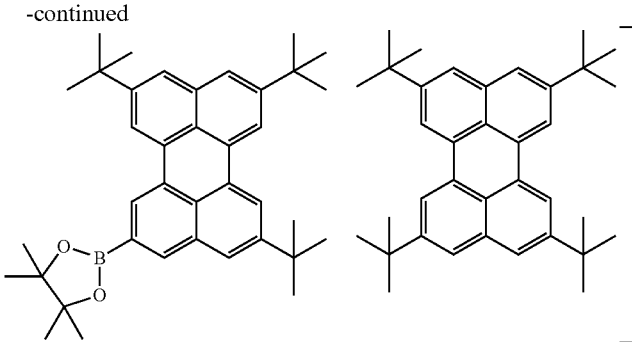

i) 75 eq. ⁱBuCl, 1 eq. AlCl₃, 1,2-dichlorobenzene, 0° C. ⟶ RT, 24 h.

ii) 0.1 eq. [Ir(COD)(OMe)]₂, 0.2 eq. 4,4′-ⁱBu₂-dipyridyl, 3 eq. bis(pinacolatodiboron), CyH, 80° C., 16 hrs. Separated by column chromatography.

Example 2

A soluble small molecular blue-emitting perylene was prepared according to the following scheme:

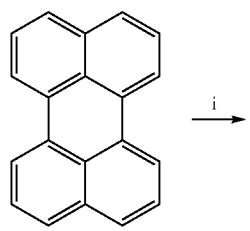

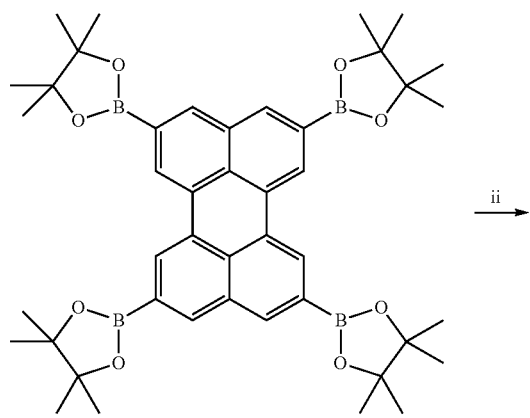

-continued

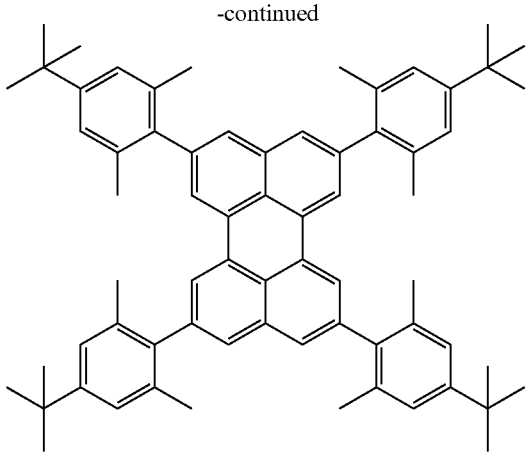

i. 0.05 eq. [Ir(COD)(OMe)]₂, 0.1 eq. 4,4′-ⁱBu₂-dipyridyl, 5 eq. bis(pinacolatodiboron), CyH, reflux, 40 hrs. Collect by filtration ii. 8 eq. 2,6-Me₂-4-ⁱBu—C₆H₂Br, 0.08 eq Pd₂(dba)₃, 0.06 eq. HPⁱBu₃BF₄, 16 eq. Cs₂CO₃, thf, reflux 16 hr. Purified by column chromatography followed by repeated recrystallisation from ⁿBuOAc/MeOH

Example 3

A monomer for forming a main chain perylene repeat unit was prepared according to the scheme below:

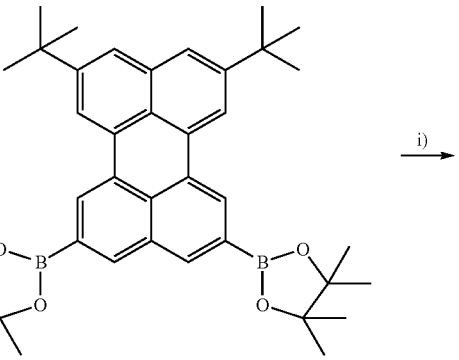

19
-continued

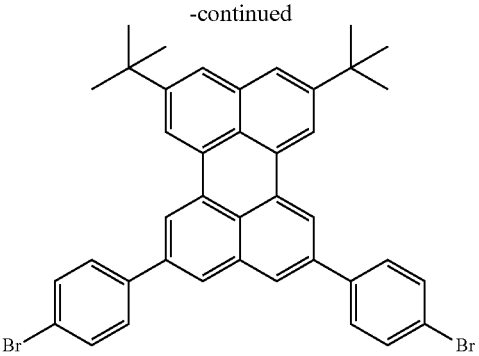

(i) 3 eq. 1-I-4-Br—C$_6$H$_4$, 0.2 eq. Pd(PPh$_3$)$_4$, 4 eq. Ag$_2$CO$_3$, anhyd, THF, reflux 2 hr. Purified by column chromatography followed by sublimation and repeated recrystallisation

Example 4

An end-capping reactive material for forming an end-capping group of a polymer was prepared according to the scheme below:

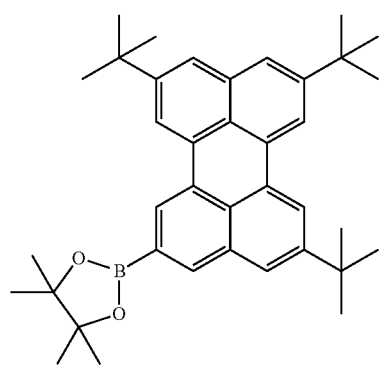

20
-continued

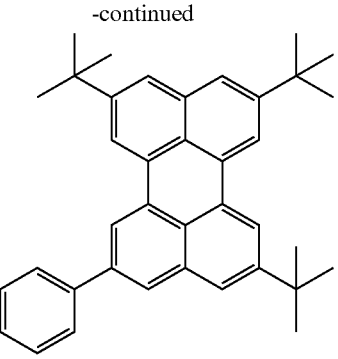

(i) 10 eq. 1-I-4-Br—C$_6$H$_4$, 0.1 eq. Pd(PPh$_3$)$_4$, 2 eq. Ag$_2$CO$_3$, anhyd, THF, reflux 3 hr. Purified by column chromatography followed by sublimation and repeated recrystallisation.

Example 5

A monomer comprising a pendent perylene group was prepared according to the method set out below:

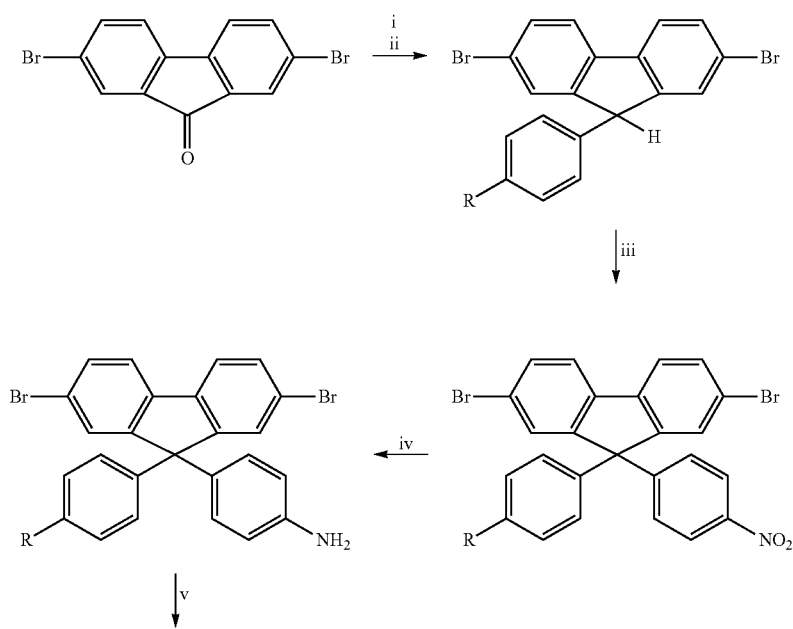

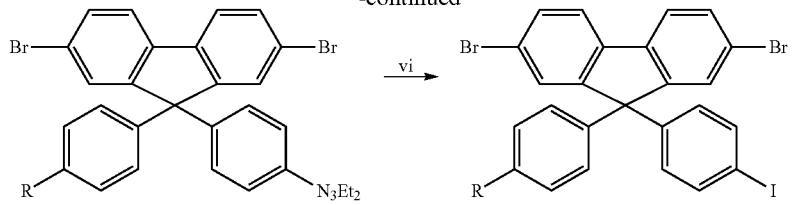

i) 8 eq. HexPh, 2 eq. CF₃SO₃H, room temp. 45° C., 3 hr
ii) 0.2 eq. Sodium 3-mercaptopropan sulfinic acid, 45° C., 6 hr. HexPh removed by distillation.
   Product precipitated into methanol and recrystallised twice from IPA/toluene.
iii) 1.2 eq. 4-F—C₆H₄NO₂, 1.5 eq. K₂CO₃, DMF, 6 h. Precipitated into water and dried.
iv) 3.75 eq. SnCl₂, EtOH, reflux, 12 hr. 2/3 EtOH removed and pH raised to
   10 with aq. NaOH. Aqueous work up with toluene, precipitated from toluene with 5 vol. eq. hexane.
v) Dissolved in 6M HCl/MeCN, cool to 0° C. Added 1.05 eq. NaNO₂ (aq) dropwise. Stir for 1 hr at 0° C.
   Added slowly to solution of 2 eq. K₂CO₃, 2 eq. NEt₂H at 0° C. Stirred for 2 hr at 0° C.
   Warmed to room temp, extracted into CHCl₃. Purified by column chromatography.
vi) Excess MeI, 2 eq I₂ 80° C. 8 hr. Removed MeI under reduced pressure, extract with CHCl₃, wash with Na₂S₂O₄.
   Purify by colum chromatography followed by repeated crystallisation from toluene/methanol.

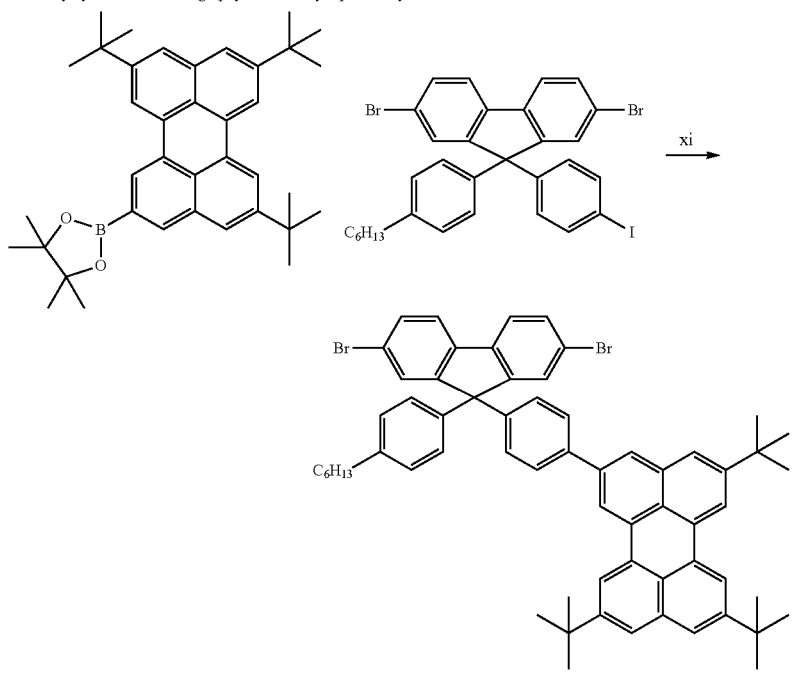

vii) 0.2 eq. Pd (PPh₃)₄, 2.5 eq. CsCO₃, anhyd. DMF, room temp, 16 h. Purified by column chromatography
   and repeated recrystallisation from ⁿBuOAc/MeOH.

Polymer Example 1

A polymer was prepared in accordance with the Suzuki process of WO 00/53656 by reaction of fluorene units of formula 6 (0.94 equivalents), amine repeat units of formula 7 (0.06 equivalents) of the type described in Example P1 of US 2005/209422, and a main chain perylene repeat unit derived from the monomer of Example 3 (0.0025 equivalents) to produce a polymer having Mr 925,000 and Mp 884,000.

Polymer Example 2

A polymer was prepared in accordance with the Suzuki process of WO 00/53656 by reaction of fluorene units of formula 6 (0.94 equivalents), amine repeat units of formula 7 (0.06 equivalents) of the type described in Example P1 of US 2005/209422, and a side chain perylene repeat unit derived from the monomer of Example 5 (0.0025 equivalents) to produce a polymer having Mr 1,087,000 and Mp 997,000.

Polymer Example 3

A polymer was prepared in accordance with the Suzuki process of WO 00/5366 by reaction of fluorene units of formula 6 (0.94 equivalents), amine repeat units of formula 7 (0.06 equivalents) of the type described in Example P1 of US 2005/209422, and an end capping group derived from the material of Example 4 (0.0025 equivalents) to produce a polymer having Mr 520,000 and Mp 443,000.

Composition Example 1

A polymer was prepared in accordance with the Suzuki process of WO 00/5366 by reaction of fluorene repeat units of formula 6 (0.94 equivalents) and amine repeat units of formula 7 (0.06 equivalents) to produce a polymer having Mr 1,280,000 and Mp 1,100,00, which was blended with the perylene compound of Example 1.

Composition Example 2

A composition was prepared as per Composition Example 1, except that the compound of Example 2 was used in place of the compound of Example 1

For the purpose of comparison, a polymer corresponding to Polymer Example 1 was prepared, except that the blue-emitting unit was provided by an amine of formula 7 in place of the perylene repeat unit.

| Split | Minolta CIE x | Minolta CIE y | Cd/A max | EQE max | Lifetime T@85Lum | Lifetime T@70Lum |
|---|---|---|---|---|---|---|
| Polymer 2 | 0.14 | 0.182 | 5.80 | 4.51 | 12 | 54 |
| Polymer 1 | 0.141 | 0.2 | 5.54 | 4.07 | 23 | 99 |
| Comparative polymer | 0.138 | 0.19 | 7.21 | 5.55 | 6 | 45 |
| Polymer 3 | 0.141 | 0.195 | 5.67 | 4.24 | 11 | 53 |
| Composition 1 | 0.141 | 0.17 | 5.86 | 4.78 | 8 | 38 |
| Composition 2 | 0.150 | 0.174 | 4.88 | 3.90 | 9 | 41 |

Conclusion

It can be seen from the results that T90 is improved with a material according to the invention, as compared with the comparison polymer. T70 is also improved in all but one case. The decay curve is therefore flatter in the early stages. This is beneficial for differential ageing since, consequently, there is less need to adjust the blue driving conditions so that the blue brightness is at the required level relative to the red and green in a full colour device.

Without wishing to be bound by theory, it is thought that the utilisation of an emitter (in this case perylene), that does not also transport holes, may increase the polymers stability. In the case of the comparison polymer, the amine emitter also transports holes.

The invention claimed is:

1. A conjugated polymer, wherein a blue-light emitting perylene is covalently bound at the 2, 5, 8 or 11 position as a side chain to the conjugated polymer main chain or as an end group of the polymer main chain, or is provided as a repeat unit in the main chain of the conjugated polymer linked through any combination of two of the 2, 5, 8 and 11 positions.

2. A conjugated polymer according to claim 1, wherein the conjugated polymer comprises an electron transporting repeat unit and/or a hole transporting repeat unit.

3. A conjugated polymer according to claim 1, wherein the blue-light emitting perylene is covalently bound as a side chain to the conjugated polymer main chain.

4. A conjugated polymer according to claim 3, wherein the blue-light emitting perylene comprises a structural unit having formula I:

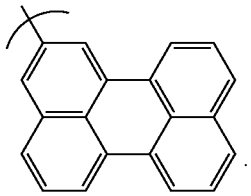

5. A conjugated polymer according to claim 4, wherein the blue-light emitting perylene comprises a structural unit having formula II:

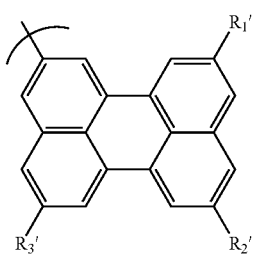

where $R_1'$, $R_2'$, and $R_3'$ each independently represent an optional substituent.

6. A conjugated polymer according to claim 1, wherein the perylene is connected to the backbone of the conjugated polymer via a spacer group.

7. A conjugated polymer according to claim 6, wherein the spacer group is phenyl.

8. A conjugated polymer according claim 7, wherein the spacer group is alkyl.

9. A conjugated polymer according to claim 1, wherein the backbone of the conjugated polymer comprises a repeat unit having formula IV:

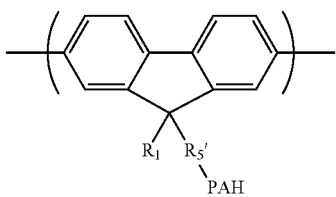

where $R_1$ represents hydrogen or optionally substituted alkyl, alkoxy, aryl, arylalkyl, heteroaryl, or heteroaryl alkyl; $R_5'$ is a spacer group; and PAH represents a blue light-emitting perylene covalently bound at the 2, 5, 8, or 11 position.

10. A conjugated polymer according to claim 9, wherein the repeat unit having formula IV is selected from the group consisting of formulae V to VIII:

V

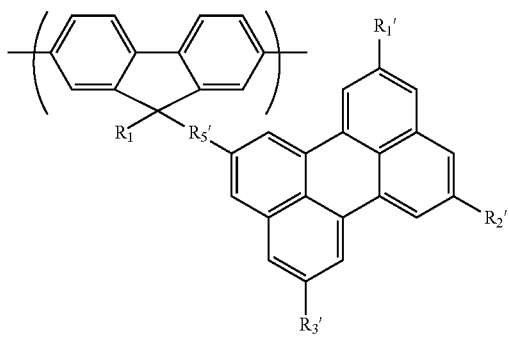

VI

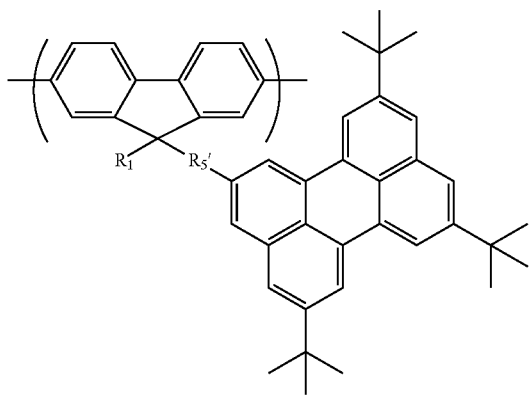

VII

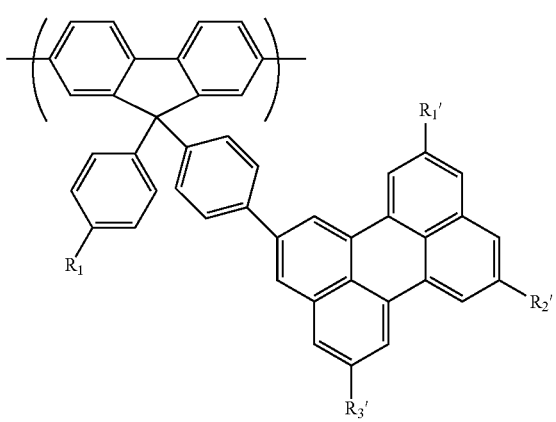

VIII

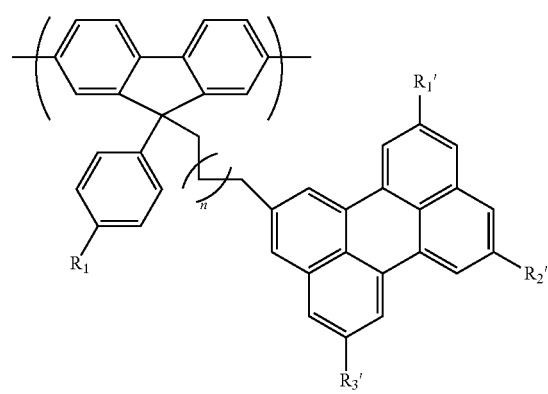

where $R_1'$, $R_2'$, and $R_3'$ each independently represent an optional substituent; $R_1$ represents hydrogen or optionally substituted alkyl, alkoxy, aryl, arylalkyl, heteroaryl, or heteroaryl alkyl; $R_5'$ is a spacer group; and n is an integer from 1 to 10.

11. A conjugated polymer according to claim 10, wherein the conjugated polymer contains up to 5 mol % of a repeat unit having one of formulae IV to VIII.

12. A conjugated polymer according to claim 1, wherein the blue-light emitting perylene is provided in the conjugated polymer main chain.

13. A conjugated polymer according to claim 12, wherein the blue-light emitting perylene comprises a structural unit having formula IX:

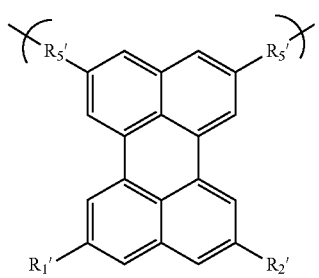

where $R_1'$ and $R_2'$ each independently represent an optional substituent and $R_5'$ is a spacer group.

14. A conjugated polymer according to claim 13, wherein the spacer group is phenyl.

15. A conjugated polymer according to claim 1, wherein the blue-light emitting perylene is provided as an end group of the conjugated polymer main chain.

16. A conjugated polymer according to claim 15, wherein the blue-light emitting perylene comprises a structural unit having formula XI:

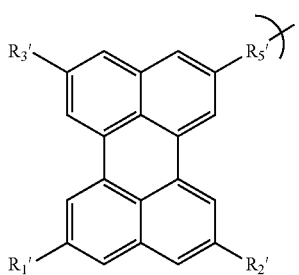

where $R_1'$, $R_2'$, and $R_3'$ each independently represent an optional sub stituent and $R_5'$ is a spacer group.

17. A conjugated polymer according to claim 16, wherein the spacer group is phenyl.

18. A method for making a polymer as defined in claim 1 using Suzuki polymerization or Yamamoto polymerization whereby monomers are polymerised, each monomer having at least two reactive groups.

19. A method according to claim 18, wherein the reactive groups are boron derivative groups selected from the group consisting of boronic acids, boronic esters, halogen, tosylate, mesylate, and triflate.

20. An organic-light emitting device (OLED) comprising an anode, a cathode, and an electroluminescent layer comprising the light-emitting material as defined in claim 1 between the anode and the cathode.

21. An OLED according to claim 20, comprising a conductive hole injection layer between the anode and the electroluminescent layer to assist hole injection from the anode into the electroluminescent layer.

22. A method of making an OLED as defined in claim 21 comprising depositing the light-emitting material from solution by solution processing to form a layer of the OLED.

23. A method according to claim 22, wherein the solution processing technique is spin-coating or inkjet printing.

24. A light source comprising an OLED as defined in claim 21.

25. A light source according to claim 24, wherein the light source is a full color display.

26. A method of making an OLED as defined in claim 20 comprising depositing the light-emitting material from solution by solution processing to form a layer of the OLED.

27. A method according to claim 26, wherein the solution processing technique is spin-coating or inkjet printing.

28. A light source comprising an OLED as defined in claim 20.

29. A light source according to claim 28, wherein the light source is a full color display.

30. A light-emitting material comprising a conjugated polymer and a blue-light emitting perylene, wherein the perylene is substituted at one or more of the 2, 5, 8, and 11, wherein the blue-light emitting perylene is provided as a separate molecule blended with the conjugated polymer.

31. A light-emitting material according to claim 30, wherein the blue-light emitting perylene comprises a structural unit having formula A:

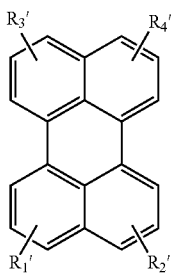

wherein R1'-R4' each independently represent an optional substituent.

32. An optionally substituted monomer of formula XIII:

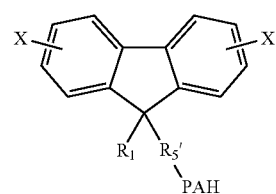

wherein X represents a polymerizable leaving group, $R_1$ represents hydrogen or optionally substituted alkyl, alkoxy, aryl, arylalkyl, heteroaryl, or heteroaryl alkyl; $R_5'$ is a spacer group; and PAH represents a perylene.

33. A monomer according to claim 32 wherein $R_1$ is optionally substituted phenyl and $R_5'$ represents optionally substituted 1,4-phenylene.

34. A monomer according to claim 32 wherein each X is independently selected from the group consisting of halogen, boronic acid, boronic ester, sulfonic acid, and sulfonic ester.

35. A monomer according to claim 34 wherein X is bromine.

36. A compound of formula XIV:

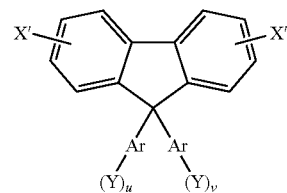

wherein each X' is independently selected from the group consisting of bromine, boronic acid, and boronic ester; each Ar represents an optionally substituted aromatic or heteroaromatic group; Y represents a reactive leaving group; u is 0 or 1; and v is 0 or 1, with the proviso that at least one of u and v is 1.

37. A compound of formula XIV according to claim 36 wherein each Ar represents phenylene optionally substituted with one or more substituents selected from the group consisting of alkyl, aryl, heteroaryl, alkoxy, alkylthio, fluorine, cyano, aralykyl, CHO, and $CO_2H$ or an ester thereof.

38. A compound according to claim 36 wherein u is 1 and v is 0.

39. A compound according to claim 36 wherein X is bromine and Y is iodine or azide.

40. A compound according to claim 39 wherein Y is an azide of formula $-N_3R_6$ wherein $R_6$ is $C_1\text{-}_{20}$ alkyl.

* * * * *